(12) United States Patent
Hyun et al.

(10) Patent No.: US 11,637,156 B2
(45) Date of Patent: Apr. 25, 2023

(54) PIXEL ARRAY SUBSTRATE AND DISPLAY DEVICE INCLUDING THE SAME

(71) Applicant: LG Display Co., Ltd., Seoul (KR)

(72) Inventors: Kwang-Min Hyun, Paju-si (KR); Sung-Wook Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 182 days.

(21) Appl. No.: 17/112,737

(22) Filed: Dec. 4, 2020

(65) Prior Publication Data

US 2021/0193759 A1 Jun. 24, 2021

(30) Foreign Application Priority Data

Dec. 23, 2019 (KR) .................. 10-2019-0173115

(51) Int. Cl.
| | | |
|---|---|---|
| H01L 27/32 | (2006.01) | |
| H01L 51/52 | (2006.01) | |
| H04N 5/225 | (2006.01) | |
| G09G 3/3208 | (2016.01) | |

(52) U.S. Cl.
CPC ....... *H01L 27/3244* (2013.01); *G09G 3/3208* (2013.01); *H01L 51/5275* (2013.01); *H01L 51/5281* (2013.01); *H04N 5/2257* (2013.01)

(58) Field of Classification Search
CPC ............ H01L 27/3244; H01L 51/5275; H01L 51/5281; G09G 3/3208; H04N 5/2257
USPC .................. 348/373; 313/504; 257/E33.001
See application file for complete search history.

(56) References Cited

U.S. PATENT DOCUMENTS

| | | | |
|---|---|---|---|
| 7,697,053 B2 | 4/2010 | Kurtz et al. | |
| 2011/0057221 A1* | 3/2011 | Sonoda | H01L 51/5275 |
| | | | 257/E33.001 |
| 2013/0002130 A1* | 1/2013 | Sumida | H01L 51/5275 |
| | | | 313/504 |
| 2016/0087018 A1 | 3/2016 | Shim et al. | |
| 2016/0091752 A1* | 3/2016 | Lien | G02F 1/133526 |
| | | | 349/68 |
| 2016/0245983 A1* | 8/2016 | Lien | G02B 6/0053 |
| 2017/0110504 A1* | 4/2017 | Panchawagh | B06B 1/0207 |
| 2018/0150671 A1* | 5/2018 | Choo | H01L 27/326 |
| 2018/0151641 A1* | 5/2018 | Choo | H04M 1/0266 |
| 2020/0401781 A1* | 12/2020 | Haddad | G06V 40/1318 |
| 2022/0013082 A1* | 1/2022 | Rodriguez, II | G09G 5/10 |

FOREIGN PATENT DOCUMENTS

| | | |
|---|---|---|
| CN | 110444125 A | 11/2019 |
| JP | 2010-509804 A | 3/2010 |
| JP | 2014-164085 A | 9/2014 |

\* cited by examiner

*Primary Examiner* — Prabodh M Dharia
(74) *Attorney, Agent, or Firm* — Seed IP Law Group LLP

(57) ABSTRACT

A display device is provided. The display device includes a pixel array including a plurality of pixels arranged in a matrix, a sensor under the pixel array, and a refracting layer over the pixel array. The pixel array includes a first region having a first resolution and overlapping the sensor and a second region having a second resolution higher than the first resolution and adjacent to the first region. The refracting layer includes a first refracting portion having a first refractive index and a second refracting portion having a second refractive index lower than the first refractive index.

21 Claims, 9 Drawing Sheets

PIXEL ARRAY SUBSTRATE AND DISPLAY DEVICE INCLUDING THE SAME

CROSS REFERENCE TO RELATED APPLICATIONS

The present application claims the priority benefit of Republic of Korea Patent Application No. 10-2019-0173115 filed in Republic of Korea on Dec. 23, 2019, which is hereby incorporated by reference in its entirety.

BACKGROUND

Technical Field

The present disclosure relates to a display device, and more particularly, to a display device including a sensor.

Description of the Related Art

A liquid crystal display (LCD) device including a liquid crystal and an organic light emitting diode (OLED) display device including a light emitting diode have been used as a display device displaying an image using a digital image data.

The OLED display device using an emissive element emitting a light without an additional light source has advantages of a fast response speed, a high emission efficiency, a great luminance and a wide viewing angle as compared with the LCD device. Since elements are formed on a flexible substrate such as a plastic in the OLED display device, a flexible display device may be obtained.

The display device where various elements are added may perform a complex function. For example, an electronic element may perform a mobile communication function, a data communication function, an image shooting function and a voice recording function. Recently, various elements such as a camera and a sensor for a multimedia function have been added to the display device.

BRIEF SUMMARY

The inventors of the present disclosure recognized the recent trends in the market of adding various elements such as a camera and a sensor for a multimedia function disposed outside of a display region. The inventors recognized that the display device where a display region of at least one surface extends substantially to a whole surface would be beneficial.

Accordingly, one or more embodiments of the present disclosure provides a pixel array substrate and a display device including the pixel array substrate where a display region of at least one surface extends substantially to a whole surface.

Further embodiments of the present disclosure provides a pixel array substrate and a display device including the pixel array substrate where a sensor is disposed in a display region.

Accordingly, the present disclosure is directed to a pixel array substrate and a display device including the pixel array substrate that substantially obviate one or more of the problems due to limitations and disadvantages of the related art.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with one or more embodiments of the present disclosure, as embodied and broadly described herein, a display device includes: a pixel array including a plurality of pixels arranged in a matrix; a sensor under the pixel array; and a refracting layer over the pixel array, wherein the pixel array includes a first region having a first resolution and overlapping the sensor and a second region having a second resolution higher than the first resolution and adjacent to the first region, and wherein the refracting layer includes a first refracting portion having a first refractive index and a second refracting portion having a second refractive index lower than the first refractive index.

In another aspect, a display device includes: a display panel including a pixel array having a plurality of pixels each including a thin film transistor layer, and a first electrode, an emitting layer and a second electrode sequentially on the thin film transistor layer; an encapsulating layer covering the display panel; a refracting layer on the encapsulating layer; and a sensor under the display panel, wherein the pixel array includes a first region having a first resolution and overlapping the sensor and a second region having a second resolution higher than the first resolution and adjacent to the first region, and wherein the refracting layer includes a first refracting portion having a first refractive index and a second refracting portion having a second refractive index lower than the first refractive index.

In another aspect, a pixel array substrate includes: a first pixel region; a second pixel region having a higher resolution than the first pixel region; a first refracting layer having at least one lens in the first pixel region to concentrate a light toward the first pixel region; and a second refracting layer in at least portion of the second pixel region to transmit a light toward the second pixel region, wherein a refractive index of the first refracting portion is higher than a refractive index of the second refracting portion.

It is to be understood that both the foregoing general description and the following detailed description are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
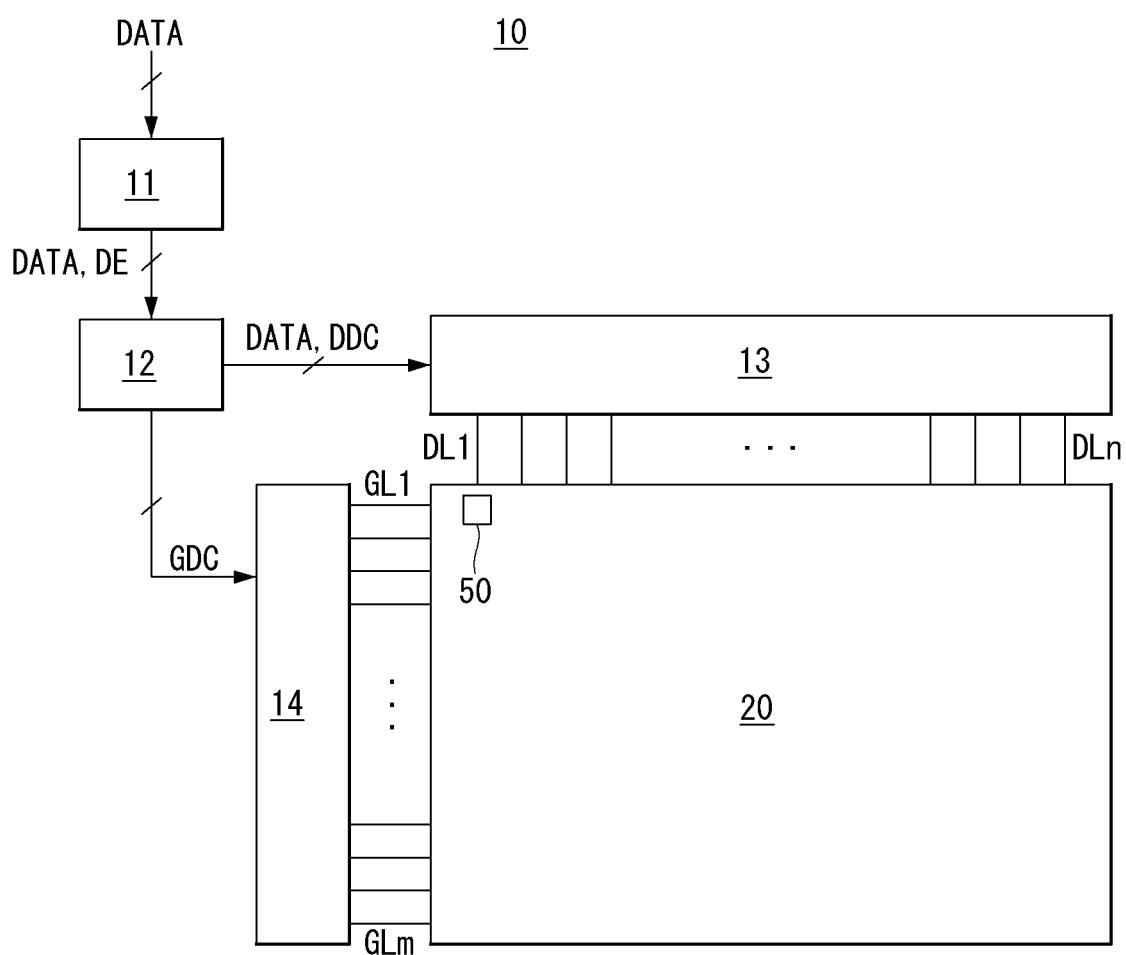
FIG. 1 is a view showing an organic light emitting display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a pixel array substrate and a display device including the pixel array substrate according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Although an organic light emitting diode (OLED) display device, a liquid crystal display (LCD) device and an electrophoretic display (EPD) device may be used as a display device according to the present disclosure, an OLED display device will be exemplarily illustrated in the present disclosure. In the OLED display device, a light emitting layer is disposed between a first electrode of an anode and a second electrode of a cathode. A hole supplied from the first electrode and an electron supplied from the second electrode are combined with each other in the light emitting layer to generate an exciton of a hole-electron pair, and the exciton transitions from an excited state to a ground state to emit a light due to an energy difference without an additional light source.

Figure 2:
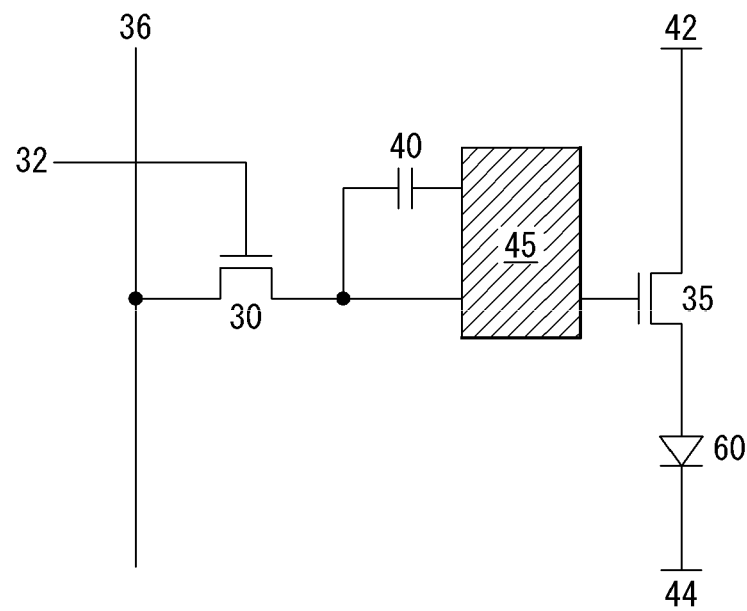
FIG. 2 is a view showing a subpixel of the organic light emitting display device according to the first embodiment of the present disclosure.
Figure 3:
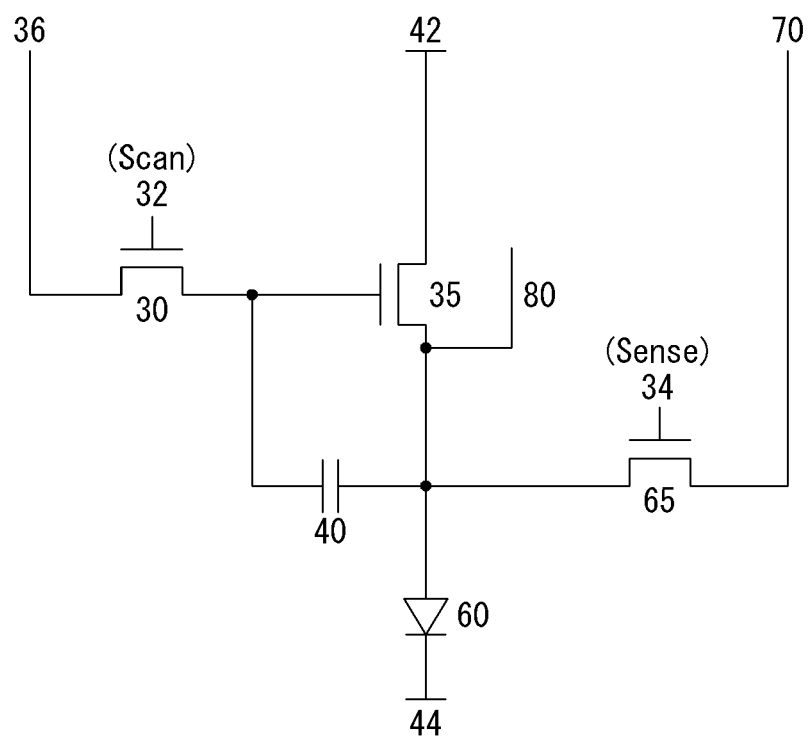
FIG. 3 is a view showing a detailed circuit of the subpixel of the organic light emitting display device according to the first embodiment of the present disclosure.

FIG. 1 is a view showing an organic light emitting display device according to a first embodiment of the present disclosure, FIG. 2 is a view showing a subpixel of the organic light emitting display device according to the first embodiment of the present disclosure, and FIG. 3 is a view showing a detailed circuit of the subpixel of the organic light emitting display device according to the first embodiment of the present disclosure.

In FIG. 1, an organic light emitting display (OLED) device 10 includes an image processing part 11, a timing controlling part 12, a data driving part 13, a gate driving part 14 and a display panel 20.

The image processing part 11 outputs a data signal DATA supplied from an exterior and a data enable signal DE. Although the image processing part 11 may output at least one of a vertical synchronization signal, a horizontal synchronization signal and a clock signal as well as the data enable signal DE, the above signals may be omitted for convenience of illustration.

The timing controlling part 12 receives a plurality of driving signals including the data enable signal DE, the vertical synchronization signal, the horizontal synchronization signal and the clock signal and the data signal DATA from the image processing part 11. The timing controlling part 12 outputs a gate control signal GDC for controlling a driving timing of the gate driving part 14 and a data control signal DDC for controlling a driving timing of the data driving part 13 based on the plurality of driving signals.

The data driving part 13 samples and latches the data signal DATA supplied from the timing controlling part 12 in response to the data control signal DDC supplied from the timing controlling part 12. The data driving part 13 converts the data signal DATA into a gamma reference voltage and outputs the gamma reference voltage. The data driving part 13 outputs the data signal DATA through a plurality of data lines DL1 to DLn. The data driving part 13 may be formed as an integrated circuit (IC).

The gate driving part 14 outputs a gate signal in response to the gate control signal GDC supplied from the timing controlling part 12. The gate driving part 14 outputs the gate signal through a plurality of gate lines GL1 to GLm. The gate driving part 14 may be formed as an integrated circuit (IC) or may be formed in the display panel 20 as a gate in panel (GIP).

The display panel 20 displays an image in response to the data signal DATA supplied from the data driving part 13 and the gate signal supplied from the gate driving part 14. The display panel 20 includes a plurality of subpixels 50 driven to display the image.

The plurality of subpixels 50 may include a red subpixel, a green subpixel and a blue subpixel or may include a white subpixel, a red subpixel, a green subpixel and a blue subpixel. The plurality of subpixels 50 may have at least one different emitting area according to an emission property.

In FIG. 2, one subpixel includes a switching transistor 30, a driving transistor 35, a capacitor 40, a compensating circuit 45 and a light emitting diode 60.

The switching transistor 30 is turned on and off (switching) in response to the gate signal supplied from a first gate line 32 such that the data signal supplied through a first data line 36 is stored as a data voltage in the capacitor 40. The driving transistor 35 is turned on and off according to the data voltage stored in the capacitor 40 such that a driving current flows between a first source line 42 of a high level voltage and a second source line 44 of a low level voltage. The light emitting diode 60 is driven to emit a light according to the driving current formed by the driving transistor 35.

The compensating circuit 45 is added in the subpixel to compensate a threshold voltage of the driving transistor 35. The compensating circuit 45 may include at least one transistor. The compensating circuit 45 may have various structures according to an external compensating method. The compensating circuit 45 will be exemplarily illustrated hereinafter.

In FIG. 3, the compensating circuit 45 may include a sensing transistor 65 and a sensing line 70 (or a reference line). The sensing transistor 65 is connected between a source electrode of the driving transistor 35 and an anode (hereinafter, a sensing node) of the light emitting diode 60. The sensing transistor 65 supplies an initializing voltage (or a sensing voltage) transmitted through the sensing line 70 to the sensing node of the driving transistor 35, or the sensing transistor 65 senses a voltage or a current of the sensing node of the driving transistor 35 or the sensing line 70.

A first electrode of the switching transistor 30 is connected to the first data line 36, and a second electrode of the switching transistor 30 is connected to the gate electrode of the driving transistor 35. A first electrode of the driving transistor 35 is connected to the first source line 42, and a second electrode of the driving transistor 35 is connected to the anode of the light emitting diode 60. A first electrode of the capacitor 40 is connected to the gate electrode of the driving transistor 35, and a second electrode of the capacitor 40 is connected to the anode of the light emitting diode 60. The anode of the light emitting diode 60 is connected to the second electrode of the driving transistor 35, and the cathode of the light emitting diode 60 is connected to the second source line 44. A first electrode of the sensing transistor 65 is connected to the sensing line 70, and a second electrode of the sensing transistor 65 is connected to the anode of the light emitting diode 60 of the sensing node and the second electrode of the driving transistor 35.

An operation timing of the sensing transistor 65 may be similar to or the same as that of the switching transistor 30 according to an external compensating algorithm (or a structure of the compensating circuit). For example, the gate electrode of the switching transistor 30 may be connected to the first gate line 32, and the gate electrode of the sensing transistor 65 may be connected to a second gate line 34. In this case, the gate signal Scan may be transmitted to the first gate line 32, and a sensing signal Sense may be transmitted to the second gate line 34. In another embodiment, the first gate line 32 connected to the gate electrode of the switching transistor 30 and the second gate line 34 connected to the gate electrode of the sensing transistor 65 may be commonly connected to each other.

The sensing line 70 may be connected to the data driving part. In this case, the data driving part senses the sensing node of the subpixel in a real time or during a non-display period or during an Nth frame (N is an integer equal to or greater than 1) and generates a sensing result. The switching transistor 30 and the sensing transistor 65 may be turned on at the same time. In this case, a sensing operation through the sensing line 70 based on a time division method of the data driving part and a data outputting operation outputting the data signal are separated (divided) from each other.

A compensation object according to the sensing result may include the data signal of a digital type, the data signal of an analog type and the gamma. The compensating circuit generating a compensation signal (or a compensation voltage) based on the sensing result may be disposed inside the data driving part or the timing controlling part, or may be formed as an additional circuit.

A light shielding layer 80 may be disposed only under a channel region of the driving transistor 35, or may be disposed under channel regions of the switching transistor 30 and the sensing transistor 65 as well as a channel region of the driving transistor 35. The light shielding layer may be used for blocking an external light or may be used as an electrode connected to another electrode or another line and constituting a capacitor. As a result, the light shielding layer may be formed of a plurality of metal layers (of different kinds of metals) to have a light shielding property.

Although the subpixel exemplarily has a 3T1C (3 transistors and 1 capacitor) structure including the switching transistor 30, the driving transistor 35, the capacitor 40, the light emitting diode 60 and the sensing transistor 65 in FIG. 3, the subpixel may have one of 3T2C, 4T2C, 5T1C and 6T2C structures including the compensating circuit 45 in another embodiment.

Figure 4:
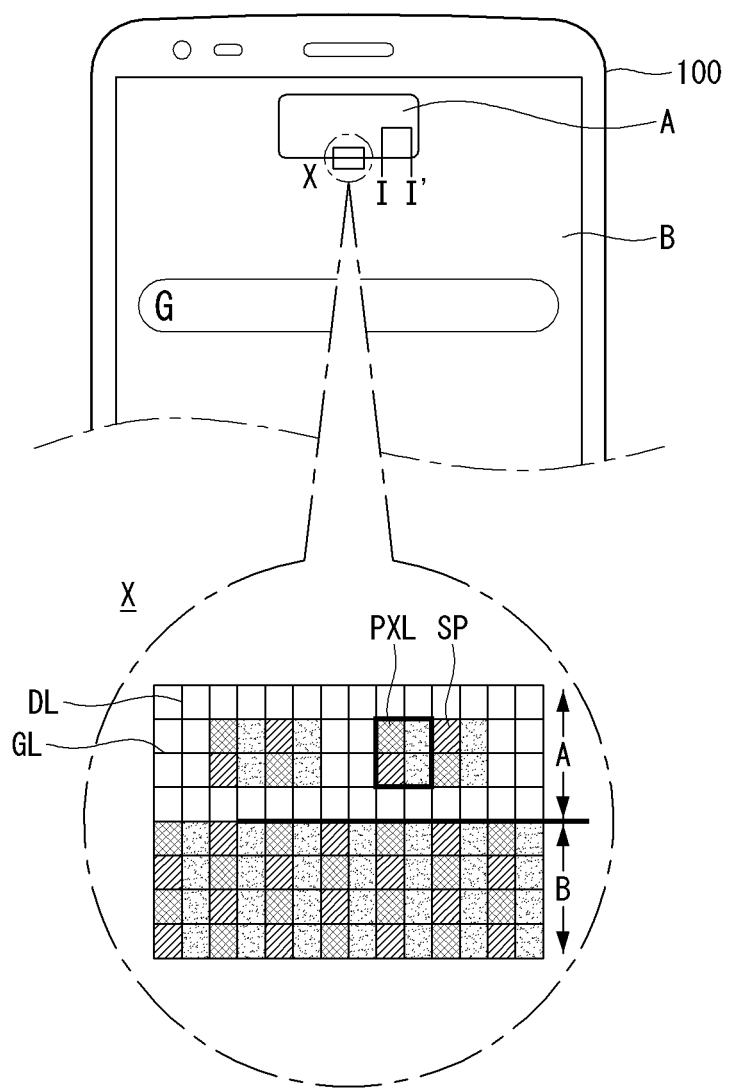
FIG. 4 is a view showing a display device according to a first embodiment of the present disclosure.
Figure 5:
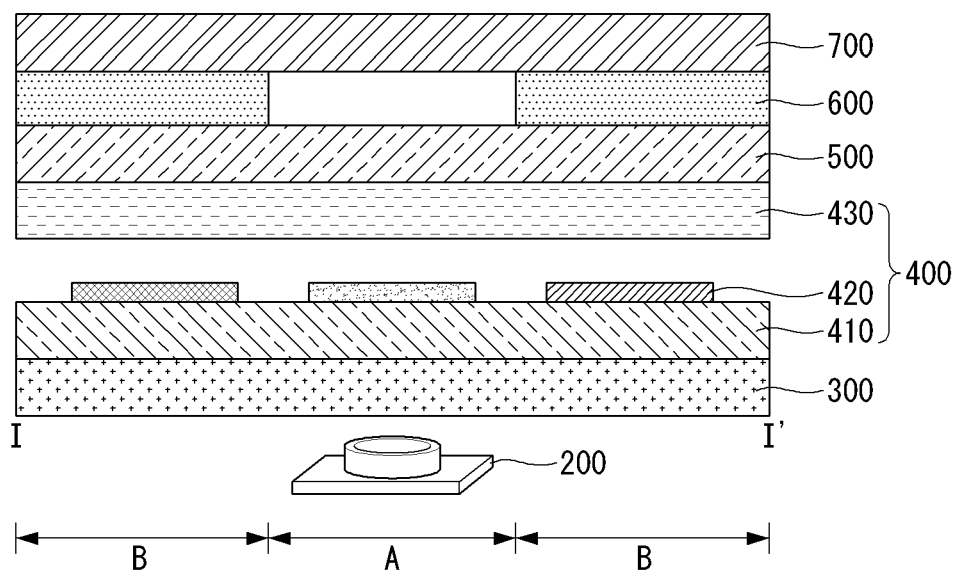
FIG. 5 is a cross-sectional view taken along a line I-I' of FIG. 4.
Figure 6:
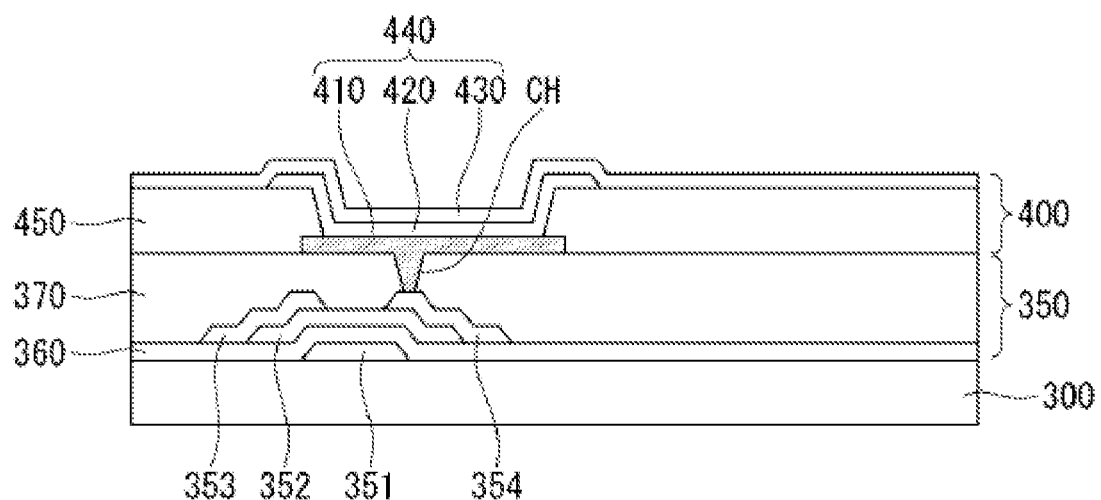
FIG. 6 is a cross-sectional view showing a subpixel of a display device according to a first embodiment of the present disclosure.

FIG. 4 is a view showing a display device according to a first embodiment of the present disclosure, FIG. 5 is a cross-sectional view taken along a line I-I' of FIG. 4, and FIG. 6 is a cross-sectional view showing a subpixel of a display device according to a first embodiment of the present disclosure.

In FIG. 4, a display device 100 according to a first embodiment of the present disclosure includes a pixel array 400 having a plurality of pixels PXL arranged along a first direction and a second direction crossing the first direction. Each of the plurality of pixels PXL may include a plurality of subpixels SP. The plurality of subpixels SP may include a red subpixel SP, a green subpixel SP and a blue subpixel SP or may include a white subpixel SP, a red subpixel SP, a green subpixel SP and a blue subpixel SP. The plurality of subpixels SP may have at least one different emitting area according to an emission property.

In FIG. 6, the display device 100 according to a first embodiment of the present disclosure includes a substrate 300, a thin film transistor (TFT), a passivation layer 370, a light emitting diode 440, a bank layer 450 and an encapsulating layer 500.

Although not shown in FIG. 6, the pixel array 400 of the display device 100 includes a gate line and a data line on the substrate 360. The gate line and the data line cross each other to define the subpixel SP and a gate insulating layer 360 is disposed between the gate line and the data line. The thin film transistor is disposed in each subpixel SP. The thin film transistor includes a gate electrode 351 connected to the gate line, a source electrode 353 connected to the data line and a drain electrode 354 spaced apart from the source electrode 353.

The gate insulating layer 360 is disposed on the gate electrode 351, and a semiconductor layer 352 is disposed on the gate insulating layer 360 to overlap the gate electrode 351. The source electrode 353 and the drain electrode 354 contact first and second end portions, respectively, of the semiconductor layer 352.

The semiconductor layer 352 may include amorphous silicon (a-Si), polycrystalline silicon (p-Si), oxide semiconductor or organic semiconductor. For example, the semiconductor layer 352 of oxide semiconductor may include indium tin oxide (ITO), indium zinc oxide (IZO), indium gallium zinc oxide (IGZO) or indium tin zinc oxide (ITZO). However, a material for the semiconductor is not limited thereto.

The passivation layer 370 is disposed on the thin film transistor to protect the thin film transistor. The passivation layer 370 may function as a planarizing layer. A plurality of light emitting diodes 440 may be disposed on the passivation layer 370. The light emitting diode 440 includes a first electrode 410, an emitting layer 420 and a second electrode 430 sequentially disposed on the passivation layer 370.

The first electrode may be an anode supplying a hole to the emitting layer 420. The anode may include a transparent conductive material having a relatively high work function. For example, the transparent conductive material may include indium tin oxide (ITO), indium zinc oxide (IZO) or indium tin zinc oxide (ITZO). However, the transparent conductive material is not limited thereto. The first electrode 410 may be connected to the drain electrode 354 through a contact hole CH in the passivation layer 370.

The second electrode may be a cathode supplying an electron to the emitting layer 420. The cathode may include a metallic material having a relatively low work function. For example, the metallic material may include silver (Ag), titanium (Ti), aluminum (Al), molybdenum (Mo) or silver magnesium (Ag:Mg). The cathode may be referred to as a common electrode. When the cathode includes silver magnesium (Ag:Mg), a resistance of the cathode may be reduced by increasing a composition ratio of silver (Ag) as compared with a composition ratio of magnesium (Mg). Here, to prevent reduction of resistance due to silver oxidation, a layer of ytterbium (Yb) may be disposed over and/or under a layer of silver magnesium (Ag:Mg).

The emitting layer 420 is disposed between the first and second electrodes 410 and 430. The emitting layer 420 emitting a different colored light is separately disposed in each subpixel SP. For example, a red emitting layer 420 for emitting a red colored light, a green emitting layer 420 for emitting a green colored light and a blue emitting layer 420 for emitting a blue colored light may be separately disposed in the red subpixel SP, the green subpixel SP and the blue subpixel SP, respectively. The red subpixel SP, the green subpixel SP and the blue subpixel SP may constitute one pixel PXL. In each of the red emitting layer 420, the green emitting layer 420 and the blue emitting layer 420, a hole and an electron supplied through the first electrode 410 and the second electrode 430, respectively, are combined with each other to emit a light. The emitting layer 420 may be patterned in each subpixel SP by depositing an organic emitting material through a mask having openings corresponding to the subpixels SP. For example, the mask may be a fine metal mask (FMM). Alternatively, the emitting layer 420 may be commonly disposed in a whole of the plurality of subpixels SP on the substrate 300. In this case, the emitting layer 420 may include an organic emitting material emitting a white colored light, and a color filter layer may be disposed to correspond to an emission area of the emitting layer 420.

The emitting layer 420 may include an injecting layer and a transporting layer as well as an emitting material layer to improve an emission efficiency of the light emitting diode 440.

The bank layer 450 may define the subpixel SP to expose a portion of a top surface of the first electrode 410. For example, the bank layer 450 may be disposed to cover an edge portion of the first electrode 410. The bank layer 450 includes an insulating material to insulate the first electrodes 410 of the adjacent subpixels SP.

In FIGS. 4 and 5, the pixel array 400 of the display device 100 according to a first embodiment of the present disclosure includes a first region A having a relatively low resolution and a second region B having a relatively high resolution. The number of pixels PXL per unit area (pixels per inch: PPI) of the first region A is smaller than the number of pixels PXL per unit area (PPI) of the second region B.

The subpixel SP of the second region B of the relatively high resolution is disposed at each of crossings of the data line DL and the gate line GL.

The subpixel SP of the first region A of the relatively low resolution is disposed at a portion of crossings of the data line DL and the gate line GL. The subpixel SP of the first region A may not be disposed at the other portion of crossings of the data line DL and the gate line GL.

The display device 100 according to a first embodiment of the present disclosure includes a sensor 200 under the pixel array 400. The sensor 200 may include at least one of a camera module, a proximity sensor, an illuminance sensor, a fingerprint sensor, and a biometric sensor. The sensor 200 of a camera module will be exemplarily illustrated hereinafter. However, the sensor 200 is not limited thereto.

The sensor 200 overlaps the first region A of the pixel array 400. At least a portion of the first region A of the pixel array 400 overlaps the sensor 200. The second region B does not overlap the sensor 200.

When the sensor 200 is activated, the pixels PXL of the first region A overlapping the sensor 200 may be deactivated. For example, when the camera module of the sensor 200 is activated, the pixels PXL of the first region A may be deactivated. Since the camera module accommodates an external light for shooting an object, a light emitted from the pixels PXL may be mixed with the external light to deteriorate a picture or an image.

In FIGS. 5 and 6, a thin film transistor (TFT) layer 350 including the thin film transistor is disposed on the substrate 300, and the pixel array 400 including the first electrode 410, the emitting layer 420 and the second electrode 430 is disposed on the TFT layer 350. The plurality of pixels PXL are arranged in the pixel array 400. The pixel array 400 includes the first region A having a relatively low resolution and the second region B having a relatively high resolution.

The sensor 200 is disposed under the pixel array 400. The sensor 200 may be disposed under the substrate 300 to overlap at least a portion of the first region A of the pixel array 400. The sensor 200 may be disposed within the first region A when viewed in front of the display device 100.

The encapsulating layer 500 is disposed on the pixel array 400. Since the emitting layer 420 is vulnerable to a moisture and an oxygen, the encapsulating layer 500 protects the emitting layer 420 from a moisture and an oxygen. The encapsulating layer 500 may include a metal layer or at least two layers of an organic material and an inorganic material.

A polarizing layer 600 is disposed on the encapsulating layer 500. The polarizing layer 600 prevents reduction of visibility of the display device 100 due to reflection of an external light on a metallic material in the display device 100. The polarizing layer 600 may have different optical properties in portions corresponding to the first and second regions A and B of the pixel array 400. For example, the polarizing layer 600 of a first portion overlapping the first region A may have a relatively high transmittance based on the sensor 200, and the polarizing layer 600 of a second portion overlapping the second region B may have a relatively low transmittance. In another embodiment, the polarizing layer 600 may have an opening in a first portion overlapping the first region A to increase a transmittance. When the polarizing layer 600 has the opening in the first portion overlapping the first region A, an amount of the external light irradiated on the sensor 200 may increase due to a relatively high transmittance.

A covering layer 700 may be disposed on the polarizing layer 600. The covering layer 700 may include a material such as a glass. To prevent a damage of the display device 100 due to an external impact, a tempered glass may be used for the covering layer 700. The covering layer 700 of a portion except for a display region may be opaquely printed.

Since the first region A having a relatively low resolution and the sensor 200 are disposed to overlap each other, the external light is easily irradiated (inputted) on the sensor 200. Since the number of subpixels SP of the first region A is smaller than the number of subpixels SP of the second region B, the transmittance of the first region A with respect to the external light increases. When the sensor is a camera module, a quality of a picture may be improved.

As a result, a full screen display where a whole surface is a display region is obtained by disposing the sensor 200 under the display region.

Figure 7:
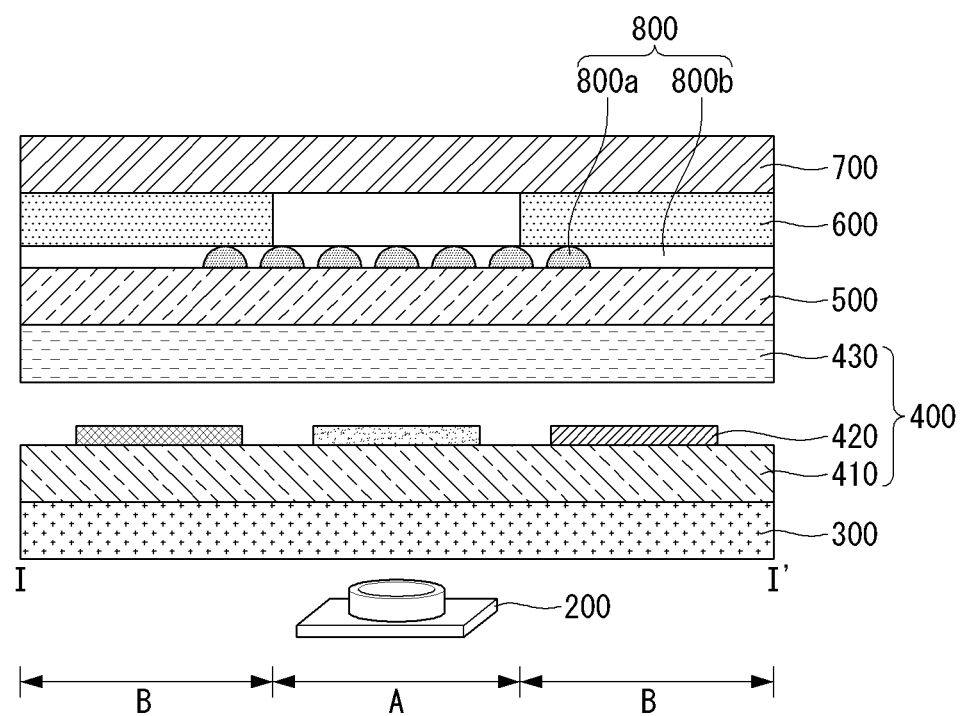
FIG. 7 is a cross-sectional view showing a display device according to a second embodiment of the present disclosure.

FIG. 7 is a cross-sectional view showing a display device according to a second embodiment of the present disclosure. FIG. 7 corresponds to a line I-I' of FIG. 4. A part of the second embodiment substantially the same as a part of the first embodiment is designated with the same reference number, and illustration of a part of the second embodiment substantially the same as a part of the first embodiment is omitted.

In FIG. 7, a display device 100 according to a second embodiment of the present disclosure further includes a refracting layer 800 between an encapsulating layer 500 and a polarizing layer 600.

A thin film transistor (TFT) layer 350 including a thin film transistor is disposed on a substrate 300, and a pixel array 400 including a first electrode 410, an emitting layer 420 and a second electrode 430 is disposed on the TFT layer 350. The pixel array 400 includes a first region A having a relatively low resolution and a second region B having a relatively high resolution.

A sensor 200 is disposed under the pixel array 400. The sensor 200 may be disposed under the substrate 300 to overlap at least a portion of the first region A of the pixel array 400. The sensor 200 may be disposed within the first region A when viewed in front of the display device 100.

The encapsulating layer 500 is disposed on the pixel array 400. Since the emitting layer 420 is vulnerable to a moisture and an oxygen, the encapsulating layer 500 protects the emitting layer 420 from a moisture and an oxygen. The encapsulating layer 500 may include a metal layer or at least two layers of an organic material and an inorganic material.

The refracting layer 800 is disposed on the encapsulating layer 500. The refracting layer 800 may include an acrylic resin. The refracting layer 800 may be a hybrid refracting layer including a plurality of refracting portions having different refractive indexes. For example, the refracting layer 800 may include a first refracting portion 800*a* having a first refractive index and a second refracting portion 800*b* having a second refractive index smaller than the first refractive index.

The first refracting portion 800*a* has a plurality of lenses each having a convex lens shape. The first refracting portion 800*a* may be disposed in a portion overlapping the first region A of the pixel array 400 and overlapping a part of the second region B adjacent to the first region A.

The second refracting portion 800*b* may be disposed on the encapsulating layer 500 to cover the first refracting portion 800*a*. The second refracting portion 800*b* may be disposed in a portion overlapping the first and second regions A and B. For example, the second refracting portion 800*b* may be disposed in a whole of a display region as a common layer.

The first refracting portion 800*a* may include a plurality of hemispherical convex lenses having an embossing shape or an uneven shape. The plurality of hemispherical convex lenses of the first refracting portion 800*a* may be disposed to be spaced apart from each other.

The first refractive index of the first refracting portion 800*a* may be greater than the second refractive index of the second refracting portion 800*b*. For example, the first refracting portion 800*a* may have a relatively high refractive index.

Figure 8:
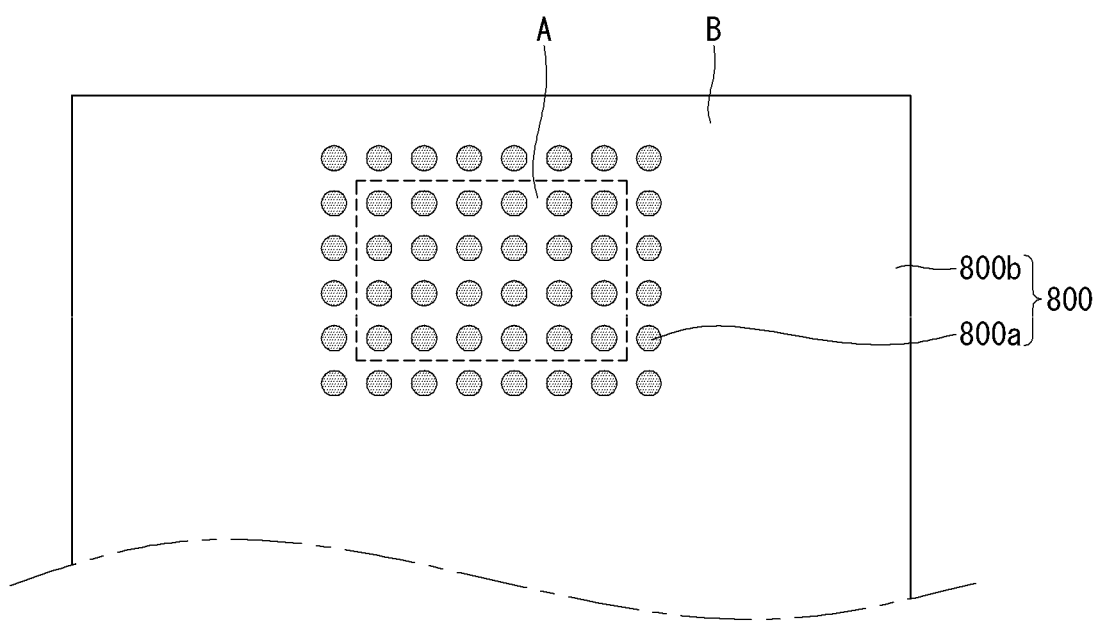
FIG. 8 is a plan view showing a refracting layer of a display device according to a second embodiment of the present disclosure.

FIG. 8 is a plan view showing a refracting layer of a display device according to a second embodiment of the present disclosure.

In FIG. 8, the display device 100 according to a second embodiment of the present disclosure may include a hybrid refracting layer having at least two refractive indexes.

The first refracting portion 800*a* having a relatively high refractive index may be disposed in a portion overlapping the first region A and a part of the second region B adjacent to the first region A. As a result, the first refracting portion 800*a* may be disposed to cover the sensor 200. The first refracting portion 800*a* may be formed through a photolithographic process using a photomask.

The second refracting portion 800*b* having a relatively low refractive index may be formed on the encapsulating layer 500. The second refracting portion 800*b* may be formed to completely cover the first refracting portion 800*a*. The second refracting portion 800*b* may be formed through a photolithographic process using a photomask. For example, the second refracting portion 800*b* may be deposited on a whole of the substrate 300 using a common photomask.

The polarizing layer 600 is disposed on the encapsulating layer 500. The polarizing layer 600 prevents reduction of visibility of the display device 100 due to reflection of an external light on a metallic material in the display device 100. The polarizing layer 600 may have different optical properties in portions corresponding to the first and second regions A and B of the pixel array 400. For example, the polarizing layer 600 of a first portion overlapping the first region A may have a relatively high transmittance based on the sensor 200, and the polarizing layer 600 of a second portion overlapping the second region B may have a relatively low transmittance. In another embodiment, the polarizing layer 600 may have an opening in a first portion overlapping the first region A to increase a transmittance.

A covering layer 700 may be disposed on the polarizing layer 600. The covering layer 700 may include a material such as a glass. To prevent a damage of the display device 100 due to an external impact, a tempered glass may be used for the covering layer 700. The covering layer 700 of a portion except for a display region may be opaquely printed.

In another aspect, the display device 100 according to a second embodiment of the present disclosure includes a pixel array substrate having a first pixel region and a second pixel region having a higher resolution than the first pixel region when viewed in front of the display device 100.

A first refracting portion including at least one lens is disposed in the first pixel region of the pixel array substrate. The first refracting portion concentrates a light toward the first pixel region. A second refracting portion is disposed in at least portion of the second pixel region of the pixel array substrate. A refractive index of the first refracting portion is higher than a refractive index of the second refracting portion.

The first refracting portion may include a plurality of first convex lenses uniformly disposed in a whole of the first pixel region. The first refracting portion may further include a plurality of second convex lenses in a portion of the second pixel region adjacent to the first pixel region. The first refracting portion and the second refracting portion may include an acrylic resin.

A polarizing layer may be disposed on the first and second refracting portions. The polarizing layer may have different optical properties in the first and second pixel regions. For example, since a sensor is disposed in the first pixel region under a substrate, the first pixel region may be a transmitting window having a relatively high transmittance. The polarizing layer in the first pixel region may have a transmittance higher than the polarizing layer in the second pixel region. The transmitting window may include an opening exposing a portion of the first pixel region for further increasing a transmittance.

Figure 9A:
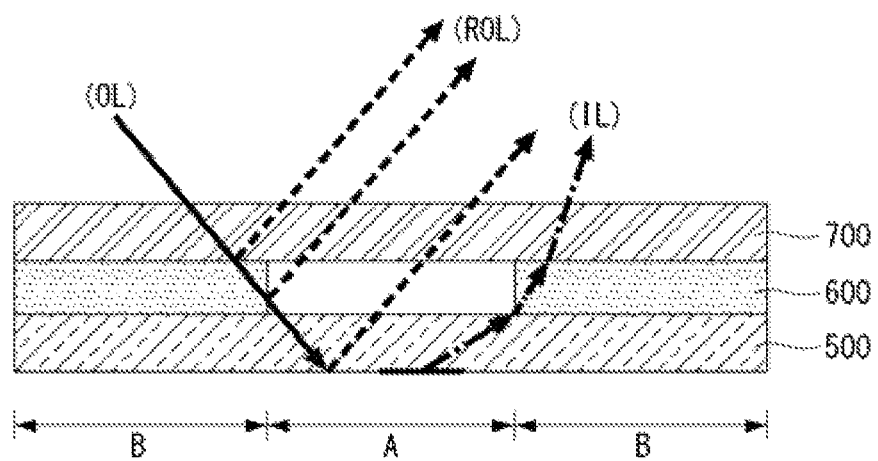
FIG. 9A is a cross-sectional view showing light paths of a display device according to a first embodiment of the present disclosure.
Figure 9B:
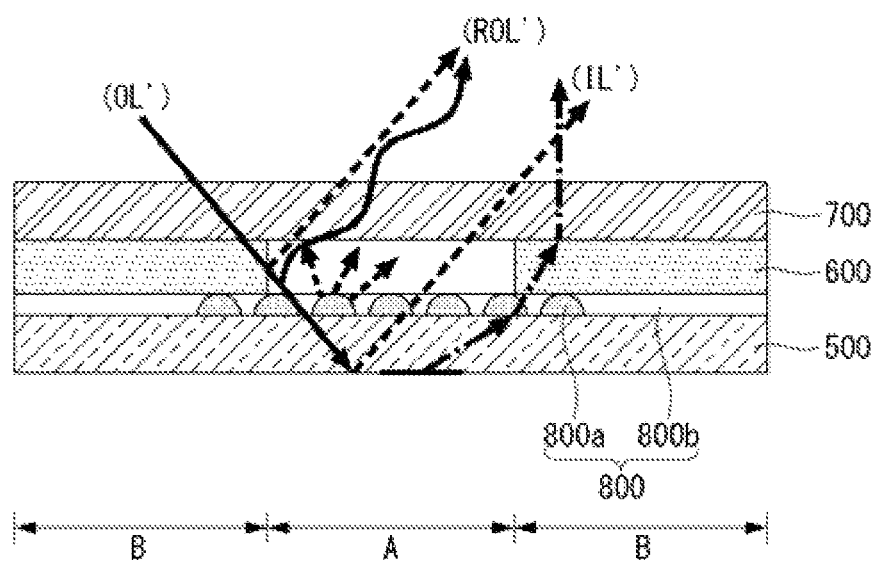
FIG. 9B is a cross-sectional view showing light paths of a display device according to a second embodiment of the present disclosure.
Figure 10A:
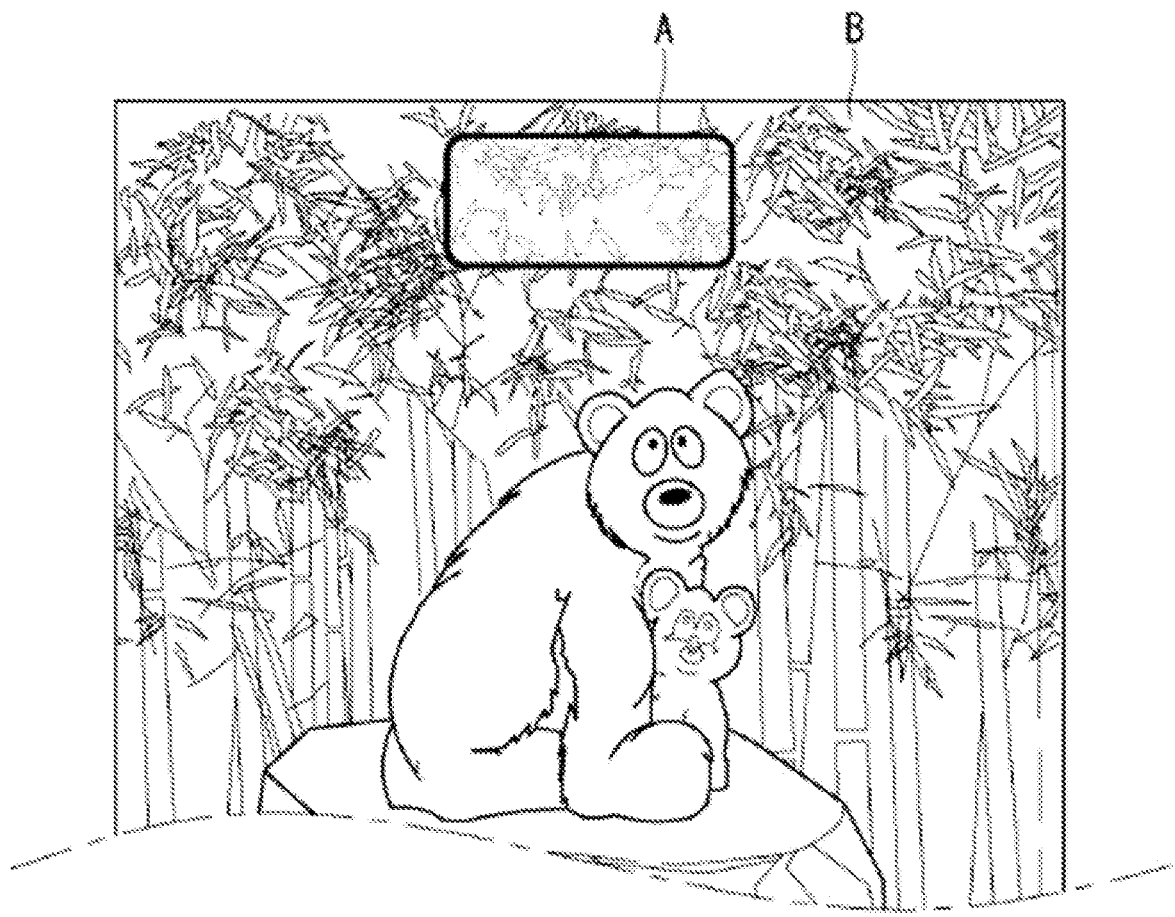
FIG. 10A is a view showing a display device according to a first embodiment of the present disclosure.

FIG. 9A is a cross-sectional view showing light paths of a display device according to a first embodiment of the present disclosure, and FIG. 9B is a cross-sectional view showing light paths of a display device according to a second embodiment of the present disclosure. FIG. 10A is a view showing a display device according to a first embodiment of the present disclosure, and FIG. 10B is a view showing a display device according to a second embodiment of the present disclosure.

In FIGS. 9A and 10A, an external light OL enters the display device 100 according to a first embodiment of the present disclosure. The external light OL is reflected at an interface between the covering layer 700 and the polarizing layer 600, a border line between the first region A and the second region B of the polarizing layer 600 and an interface between the encapsulating layer 500 and the pixel array 400 to be outputted as reflected lights ROL.

Since the display device 100 does not include a refracting layer 800, the reflected lights ROL are parallel to each other. As a result, a boundary line of a region where the sensor 200 is disposed may be recognized. For example, the border line between the first region A having a relatively low resolution and the second region B having a relatively high resolution may be recognized by a user.

Figure 10B:
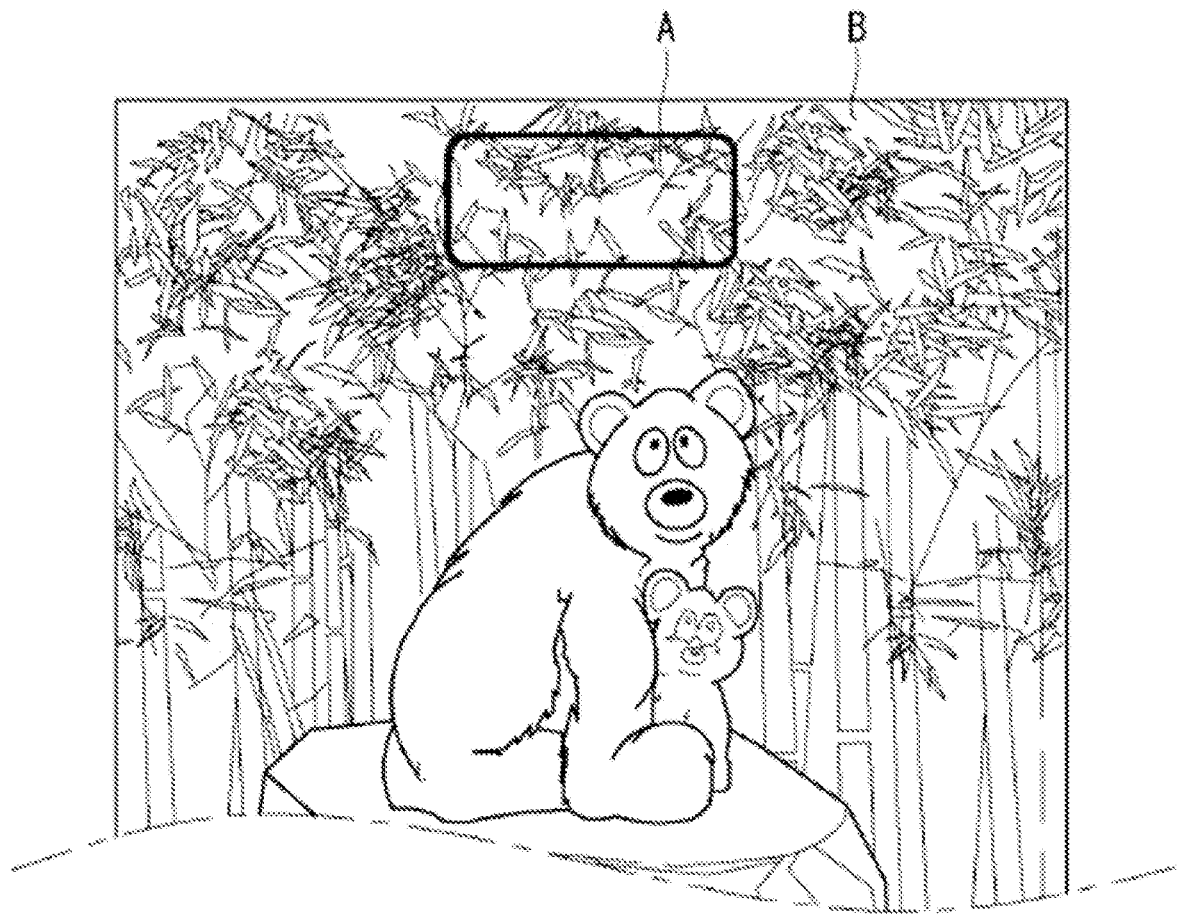
FIG. 10B is a view showing a display device according to a second embodiment of the present disclosure.

In FIGS. 9B and 10B, an external light OL' enters the display device 100 according to a second embodiment of the present disclosure. The external light OL' is reflected at an interface between the covering layer 700 and the polarizing layer 600, a border line between the first region A and the second region B of the polarizing layer 600 and an interface between the encapsulating layer 500 and the pixel array 400 to be outputted as reflected lights ROL'. In addition, the external light OL' is reflected at a top surface of the plurality of convex lenses of the first refracting portion 800a to be outputted as the reflected lights ROL'. The reflected lights ROL' from the top surface of the plurality of convex lenses of the first refracting portion 800a are outputted along various directions.

Since the display device 100 includes a refracting layer 800 of a hybrid reflecting layer, the reflected lights ROL' are scattered along various directions. As a result, a boundary line of a region where the sensor 200 is disposed may not be recognized. For example, a border line between the first region A having a relatively low resolution and the second region B having a relatively high resolution may not be recognized by a user.

In FIG. 9A, a light emitted from the emitting layer 420 of the pixel array 400 is refracted at the interface between the pixel array 400 and the encapsulating layer 500, the interface between the encapsulating layer 500 and the polarizing layer 600 and the interface between the polarizing layer 600 and the covering layer 700 to be outputted as a refracted light IL along a diagonal direction.

In FIG. 9B, a light emitted from the emitting layer 420 of the pixel array 400 is refracted at the interface between the pixel array 400 and the encapsulating layer 500, the interface between the encapsulating layer 500 and the refracting layer 800 and the interface between the polarizing layer 600 and the covering layer 700 to be outputted as a refracted light IL' along a front direction. Since the display device 100 include a refracting layer 800 of a hybrid reflecting layer, the refracted light IL' is further refracted as compared with the refracted light IL to have the front direction.

A vertical component of a light adjacent to the first region A increases due to the plurality of convex lenses of the first refracting portion 800a. As a result, a luminance of the first region A increases. The border line between the first region A and the second region B may be recognized due to a luminance difference according to the number difference of the pixels PXL of the first region A and the second region B. A luminance of the relatively low PPI region is lower than a luminance of the relatively high PPI region.

In the display device 100 according to a second embodiment of the present disclosure, the reflected lights ROL' are scattered along various directions and a luminance difference between the first region A and the second region B is reduced due to the refracting layer 800. As a result, visibility of the border line between the first region A and the second region B is reduced.

Consequently, in the pixel array substrate and the display device including the pixel array substrate, since the sensor such as a camera module is disposed under the pixel array, a full screen is obtained.

In addition, since the refracting layer is disposed over the sensor such as a camera module, the sensor is not recognized.

According to the present disclosure, further aspects of a display device are provided. A display device includes: a pixel array including a plurality of pixels arranged in a matrix; a sensor under the pixel array; and a refracting layer over the pixel array, wherein the pixel array includes a first region having a first resolution and overlapping with the sensor and a second region having a second resolution higher than the first resolution and adjacent to the first region, and wherein the refracting layer includes a first refracting portion having a first refractive index and a second refracting portion having a second refractive index lower than the first refractive index.

In one or more embodiments, the first refracting portion is disposed to cover the first region and a portion of the second region adjacent to the first region, and the second refracting portion covers the first region and the second region to overlap the first refracting portion.

In one or more embodiments, the first refracting portion includes a plurality of hemispherical convex lenses.

In one or more embodiments, the plurality of hemispherical convex lenses are spaced apart from each other.

In one or more embodiments, the first refracting portion and the second refracting portion include an acrylic resin.

In one or more embodiments, a transmittance of the first region is higher than a transmittance of the second region.

In one or more embodiments, the sensor includes a camera or a camera module.

In one or more embodiments, when the camera or a camera module is activated, the plurality of pixels in the first region are deactivated.

In one or more embodiments, a display device includes: a display panel including a pixel array having a plurality of pixels each including a thin film transistor layer, and a first electrode, an emitting layer and a second electrode sequentially on the thin film transistor layer; an encapsulating layer covering the display panel; a refracting layer on the encapsulating layer; and a sensor under the display panel, wherein the pixel array includes a first region having a first resolution and overlapping the sensor and a second region having a second resolution higher than the first resolution and adjacent to the first region, and wherein the refracting layer includes a first refracting portion having a first refractive index and a second refracting portion having a second refractive index lower than the first refractive index.

In one or more embodiments, the first refracting portion is disposed to cover the first region and a portion of the second region adjacent to the first region, and the second refracting portion covers the first region and the second region to overlap the first refracting portion.

In one or more embodiments, the display device further includes: a polarizing layer on the refracting layer, the polarizing layer having at least two portions of different transmittances; and a covering layer on the polarizing layer, wherein a transmittance of the polarizing layer over the first region is higher than a transmittance of the polarizing layer over the second region.

In one or more embodiments, the polarizing layer has an opening overlapping the sensor in the first region.

In one or more embodiments, a pixel array substrate includes: a first pixel region; a second pixel region having a higher resolution than the first pixel region; a first refracting layer having at least one lens in the first pixel region to concentrate a light toward the first pixel region; and a second refracting layer in at least portion of the second pixel region to transmit a light toward the second pixel region, wherein a refractive index of the first refracting portion is higher than a refractive index of the second refracting portion.

In one or more embodiments, the first refracting portion includes a plurality of convex lenses uniformly arranged in a whole of the first pixel region.

In one or more embodiments, the first refracting portion further includes a plurality of lenses in a portion of the second pixel region adjacent to the first pixel region.

In one or more embodiments, the display device further includes a polarizing layer on the first refracting portion and the second refracting portion.

In one or more embodiments, the polarizing layer includes a transmitting window in the first pixel region.

In one or more embodiments, the transmitting window includes an opening exposing the first pixel region.

In one or more embodiments, the first refracting portion and the second refracting portion include an acrylic resin.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a pixel array including a plurality of pixels arranged in a matrix, the pixel array including a first region and a second region;
a sensor under the pixel array;
a polarizing layer over the pixel array; and
a refracting layer between the pixel array and the polarizing layer,
wherein the first region has a first resolution and the second region has a second resolution higher than the first resolution,
wherein the first region overlaps with the sensor, and the second region is adjacent to the first region, and
wherein the refracting layer includes a first refracting portion having a first refractive index and a second refracting portion having a second refractive index lower than the first refractive index.

2. The device of claim 1, wherein the first refracting portion is disposed to at least partially cover the first region and a portion of the second region adjacent to the first region, and
wherein the second refracting portion at least partially covers the first region and the second region to overlap with the first refracting portion.

3. The device of claim 2, wherein the first refracting portion includes a plurality of hemispherical convex lenses.

4. The device of claim 3, wherein the plurality of hemispherical convex lenses are spaced apart from each other.

5. The device of claim 1, wherein the first refracting portion and the second refracting portion include an acrylic resin.

6. The device of claim 1, wherein a transmittance of the first region is higher than a transmittance of the second region.

7. The device of claim 1, wherein the sensor includes a camera module.

8. The device of claim 7, wherein when the camera module is activated, the plurality of pixels in the first region are deactivated.

9. The device of claim 1, wherein the second region is disposed outside the first region in a plan view.

10. The device of claim 1, wherein the first refracting portion includes a plurality of lenses over the pixel array to correspond to the first region, and the second refracting portion covers the plurality of lenses to correspond to the first and second regions.

11. A display device, comprising:
a display panel including a pixel array having a plurality of pixels, each of the pixels including:
a thin film transistor layer;
a first electrode;
an emitting layer; and
a second electrode, wherein the first electrode, the emitting layer, and the second electrode are sequentially on the thin film transistor layer;
an encapsulating layer at least partially covering the display panel;
a polarizing layer on the encapsulating layer;
a refracting layer between the polarizing layer and the encapsulating layer; and
a sensor under the display panel,
wherein the pixel array includes a first region having a first resolution and a second region having a second resolution higher than the first resolution,
wherein the first region overlaps with the sensor and the second region is adjacent to the first region, and
wherein the refracting layer includes a first refracting portion having a first refractive index and a second refracting portion having a second refractive index lower than the first refractive index.

12. The device of claim 11, wherein the first refracting portion is disposed to at least partially cover the first region and a portion of the second region adjacent to the first region, and
wherein the second refracting portion at least partially covers the first region and the second region to overlap the first refracting portion.

13. The device of claim 11, further comprising:
a covering layer on the polarizing layer,
wherein the polarizing layer has at least two portions of different transmittances, and
wherein a transmittance of the polarizing layer over the first region is higher than a transmittance of the polarizing layer over the second region.

14. The device of claim 13, wherein the polarizing layer has an opening overlapping the sensor in the first region.

15. A display device, comprising:
a first pixel region on a pixel array substrate;
a second pixel region on the pixel array substrate, the second pixel region having a higher resolution than the first pixel region;
a polarizing layer over the first and second pixel regions;
a first refracting layer between the polarizing layer and the pixel array substrate, the first refracting layer having at least one lens in the first pixel region to concentrate a light toward the first pixel region; and
a second refracting layer between the polarizing layer and the pixel array substrate, the second refracting layer in at least a portion of the second pixel region to transmit a light toward the second pixel region,
wherein a refractive index of the first refracting layer is higher than a refractive index of the second refracting layer.

16. The display device of claim 15, wherein the first refracting layer includes a plurality of convex lenses arranged in at least a portion of the first pixel region.

17. The display device of claim 15, wherein the first refracting layer further includes a plurality of lenses in a portion of the second pixel region adjacent to the first pixel region.

18. The display device of claim 15, wherein the polarizing layer includes a transmitting window in the first pixel region.

19. The display device of claim 18, wherein the transmitting window includes an opening exposing the first pixel region.

20. The display device of claim 15, wherein the first refracting layer and the second refracting layer include an acrylic resin.

21. The display device of claim 15, wherein the first refracting layer includes a plurality of convex lenses uniformly arranged in an entire first pixel region.

* * * * *